US011433438B2

(12) United States Patent
Choi

(10) Patent No.: US 11,433,438 B2
(45) Date of Patent: Sep. 6, 2022

(54) DISSOLVED OZONE REMOVAL UNIT, SUBSTRATE TREATING APPARATUS INCLUDING THE SAME, AND SUBSTRATE TREATING METHOD

(71) Applicant: SEMES CO., LTD., Cheonan-si (KR)

(72) Inventor: Moon Soon Choi, Chungcheongnam-do (KR)

(73) Assignee: SEMES CO., LTD., Cheonan-si (KR)

( * ) Notice: Subject to any disclaimer, the term of this patent is extended or adjusted under 35 U.S.C. 154(b) by 0 days.

(21) Appl. No.: 16/718,011

(22) Filed: Dec. 17, 2019

(65) Prior Publication Data
US 2020/0188968 A1    Jun. 18, 2020

(30) Foreign Application Priority Data
Dec. 18, 2018   (KR) .................. 10-2018-0164007

(51) Int. Cl.
*B08B 7/00*       (2006.01)
*H01L 21/67*     (2006.01)
*H01L 21/02*     (2006.01)

(52) U.S. Cl.
CPC ...... *B08B 7/0057* (2013.01); *H01L 21/02057* (2013.01); *H01L 21/67051* (2013.01)

(58) Field of Classification Search
CPC ............. B08B 7/0057; H01L 21/02057; H01L 21/67051; H01L 21/67742; H01L 21/67766; H01L 21/6704; H01L 21/67028; H01L 21/67126; H01L 21/67242; C02F 1/58; C02F 1/325; B01D 53/66; B01D 53/32; B01D 2259/804
See application file for complete search history.

(56) References Cited

U.S. PATENT DOCUMENTS 5,069,885 A  * 12/1991  Ritchie ............... B01J 16/005
                                                                 422/186
6,547,963 B1 *  4/2003  Tsai ...................... C02F 1/325
                                                                 210/232
(Continued)

FOREIGN PATENT DOCUMENTS

JP          H11-33567 A      2/1999
JP          2002-001318 A    1/2002
(Continued)

OTHER PUBLICATIONS

Translation of JP 2002001318. (Year: 2021).*
Translation of KR 20170072699. (Year: 2021).*
Translation of KR 20-0287643. (Year: 2022).*

*Primary Examiner* — Alexander Markoff
(74) *Attorney, Agent, or Firm* — Procopio, Cory, Hargreaves & Savitch LLP

(57) ABSTRACT

The inventive concept relates to a dissolved ozone removal unit, a substrate treating apparatus including the same, and a substrate treating method. The dissolved ozone removal unit includes a fluid channel providing member having a fluid channel through which a processing liquid passes and a light source member that is mounted in the fluid channel providing member and that supplies UV light to the processing liquid, and the fluid channel providing member includes a helical fluid channel configured such that the processing liquid is exposed to the UV light while helically moving around the light source member.

29 Claims, 11 Drawing Sheets

(56) References Cited

U.S. PATENT DOCUMENTS

| | | | | |
|---|---|---|---|---|
| 2007/0003430 | A1* | 1/2007 | Kaiser | A61M 1/3683 |
| | | | | 426/248 |
| 2009/0145855 | A1* | 6/2009 | Day | C02F 1/325 |
| | | | | 210/748.14 |
| 2011/0318237 | A1* | 12/2011 | Woodling | C02F 1/325 |
| | | | | 422/186.3 |
| 2019/0092653 | A1* | 3/2019 | Arbeus | C02F 1/78 |
| 2020/0188968 | A1* | 6/2020 | Choi | H01L 21/67051 |

FOREIGN PATENT DOCUMENTS

| | | |
|---|---|---|
| JP | 2006-75731 A | 3/2006 |
| KR | 20-0287643 Y1 | 8/2002 |
| KR | 20-0326013 B | 9/2003 |
| KR | 10-2006-0053539 A | 5/2006 |
| KR | 10-2008-0066631 A | 7/2008 |
| KR | 10-0944806 B | 2/2010 |
| KR | 10-1776024 B | 9/2017 |
| KR | 10-1776024 B1 | 9/2017 |

* cited by examiner

DISSOLVED OZONE REMOVAL UNIT, SUBSTRATE TREATING APPARATUS INCLUDING THE SAME, AND SUBSTRATE TREATING METHOD

CROSS-REFERENCE TO RELATED APPLICATIONS

A claim for priority under 35 U.S.C. § 119 is made to Korean Patent Application No. 10-2018-0164007 filed on Dec. 18, 2018, in the Korean Intellectual Property Office, the entire contents of which are hereby incorporated by reference.

BACKGROUND

Embodiments of the inventive concept described herein relate to a dissolved ozone removal unit for removing dissolved ozone in a processing liquid used in a process of treating a substrate, a substrate treating apparatus including the dissolved ozone removal unit, and a substrate treating method.

In general, various processes such as a photoresist coating process, a developing process, an etching process, an ashing process, and the like are performed to treat a glass substrate or a wafer in a process of manufacturing a flat panel display device or semiconductor elements.

In particular, due to high-density, high-integration, and high-performance of semiconductor elements, the scaling-down of a circuit pattern rapidly proceeds. Therefore, contaminants such as particles, organic contaminants, metal contaminants, or the like remaining on a substrate greatly affect the characteristics and yield of the semiconductor elements. Due to this, a cleaning process of removing various types of contaminants adhering to a substrate surface is emerging as a major issue in semiconductor manufacturing processes. The cleaning process is performed before and after each unit process of manufacturing semiconductor elements.

Meanwhile, a processing liquid containing high-concentration ozone may be used in the cleaning process. The processing liquid is used to treat a substrate and then discarded after the dissolved ozone is removed from the processing liquid.

Dissolved ozone removal methods using catalysts may be used to remove the dissolved ozone in the processing liquid. The dissolved ozone removal methods using the catalysts include a method of removing dissolved ozone by a direct reaction of the ozone with activated carbon. Alternatively, a method of removing dissolved ozone using manganese dioxide, which is metal oxide, may be used.

However, in the case of the dissolved ozone removal methods using the catalysts, the catalysts need to be periodically replaced because the lifetime of the catalysts is fixed.

SUMMARY

Embodiments of the inventive concept provide a dissolved ozone removal unit for efficiently removing dissolved ozone in a processing liquid used to treat a substrate, a substrate treating apparatus including the dissolved ozone removal unit, and a substrate treating method.

Embodiments of the inventive concept provide a dissolved ozone removal unit for significantly reducing ozone removal time, a substrate treating apparatus including the dissolved ozone removal unit, and a substrate treating method.

Embodiments of the inventive concept provide a dissolved ozone removal unit for rapidly and stably removing dissolved ozone from a large amount of high-concentration ozone water, a substrate treating apparatus including the dissolved ozone removal unit, and a substrate treating method.

The technical problems to be solved by the inventive concept are not limited to the aforementioned problems, and any other technical problems not mentioned herein will be clearly understood from the following description by those skilled in the art to which the inventive concept pertains.

According to an exemplary embodiment, a dissolved ozone removal unit for removing dissolved ozone contained in a processing liquid includes a fluid channel providing member having a fluid channel through which the processing liquid passes and a light source member that is mounted in the fluid channel providing member and that supplies UV light to the processing liquid. The fluid channel providing member includes a helical fluid channel configured such that the processing liquid is exposed to the UV light while helically moving around the light source member.

The light source member may be detachably mounted in a receiving space in the middle of the fluid channel providing member so as not to make direct contact with the processing liquid.

The fluid channel providing member may further include a housing including an inner cylinder that surrounds the light source member and an outer cylinder coaxially disposed outside the inner cylinder such that the helical fluid channel is provided between the inner cylinder and the outer cylinder.

The housing may further include a helical blade mounted between the outer cylinder and the inner cylinder, and the helical fluid channel may be formed by air-tightly coupling an outer diameter surface of the helical blade to an inner diameter surface of the outer cylinder and air-tightly coupling an inner diameter surface of the helical blade to an outer diameter surface of the inner cylinder.

The helical fluid channel may include a helical groove formed on an outer diameter surface of the inner cylinder or a helical groove formed on an inner diameter surface of the outer cylinder.

The housing may be open at one end thereof so as to connect to a receiving space of the inner cylinder, and the light source member may include a lamp tube located in the receiving space of the inner cylinder through the open one end of the housing.

The housing may be formed of a UV-transmitting material.

The housing may further include an inlet port that is provided at one end of the housing in a direction perpendicular to a lengthwise direction of the outer cylinder and through which the processing liquid is introduced into the helical fluid channel from the outside and an outlet port that is provided at an opposite end of the housing in the direction perpendicular to the lengthwise direction of the outer cylinder and through which the processing liquid from which the dissolved ozone is removed is drained from the helical fluid channel.

The housing may further include, on an upper side thereof, an exhaust tube through which removed ozone gas is released from the helical fluid channel.

The dissolved ozone removal unit may further include a gas decomposition member that is connected with the exhaust tube and that decomposes the ozone gas.

The housing may be disposed in a vertical position such that the one end of the housing at which the inlet port is located is directed toward an upper direction.

The housing may be disposed in a horizontal position.

The housing may include at least two housings stacked one above another, and the fluid channel providing member may provide a serial fluid channel structure in which an outlet port of a housing disposed in a higher position among the at least two housings is connected with an inlet port of a housing disposed in a lower position.

The light source member may include a lamp tube having one end portion that is closed and an opposite end portion that is air-tightly coupled to a rear cap, and the fluid channel providing member may further include a tube that is helically wound around the lamp tube to provide the helical fluid channel, the tube being formed of a UV-transmitting material.

The light source member may include one or more UV lamps.

The dissolved ozone removal unit may further include a measurement member that is installed at the outlet port and that measures an amount of the dissolved ozone in the processing liquid.

According to an exemplary embodiment, an apparatus for treating a substrate includes a cup having a process space therein, a support unit that supports the substrate in the process space, a liquid dispensing unit that dispenses a processing liquid containing ozone onto the substrate placed on the support unit, and a dissolved ozone removal unit that removes the ozone from the processing liquid drained from the process space. The dissolved ozone removal unit includes a housing having a fluid channel through which the processing liquid flows and a light source member that is disposed in the housing and that supplies UV light to the processing liquid. The housing has a tube shape having a helical fluid channel formed therein.

The housing may include, on opposite end portions thereof, an inlet port and an outlet port through which the processing liquid is introduced into and drained from the fluid channel in a direction perpendicular to a lengthwise direction of the housing.

The housing may further include a receiving space in which the light source member is mounted, and the fluid channel may surround the light source member mounted in the receiving space.

The housing may be open at one end thereof so as to connect to the receiving space, and the light source member may include a lamp tube located in the receiving space through the open one end of the housing.

The housing may further include, on an upper central portion thereof, an exhaust port through which removed ozone is released.

The housing may include an inner cylinder, an outer cylinder, and a helical blade mounted between the inner cylinder and the outer cylinder, and the fluid channel may be formed by air-tightly coupling an outer diameter surface of the helical blade to an inner diameter surface of the outer cylinder and air-tightly coupling an inner diameter surface of the helical blade to an outer diameter surface of the inner cylinder.

The housing may include an inner cylinder that surrounds the light source member and an outer cylinder coaxially disposed outside the inner cylinder. The fluid channel may include a helical groove formed on an outer diameter surface of the inner cylinder or a helical groove formed on an inner diameter surface of the outer cylinder.

The housing may be formed of a UV-transmitting material.

The housing may include a plurality of housings arranged parallel to each other in a direction perpendicular to a lengthwise direction of the housing, and the housings may be connected together in series.

The apparatus may further include a collection member in which ozone released from each of the housings is collected.

The light source member may include one or more UV lamps.

The dissolved ozone removal unit may further include a measurement member that is installed at the outlet port and that measures an amount of the ozone dissolved in the processing liquid.

According to an exemplary embodiment, a method for treating a substrate includes treating the substrate by dispensing a processing liquid containing ozone water onto the substrate and removing dissolved ozone in the processing liquid recovered while the substrate is treated or after the substrate is treated and discharging the removed ozone to the outside. The removal of the dissolved ozone is performed by supplying light to the processing liquid by a light source member and allowing the processing liquid to be exposed to the light while moving along a helical fluid channel.

The dissolved ozone removed from the processing liquid may be released through an exhaust port formed on the fluid channel and may be separately discharged through a collection apparatus.

The light may include UV light.

The light source member may supply the light from a space divided from the fluid channel through which the processing liquid passes.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
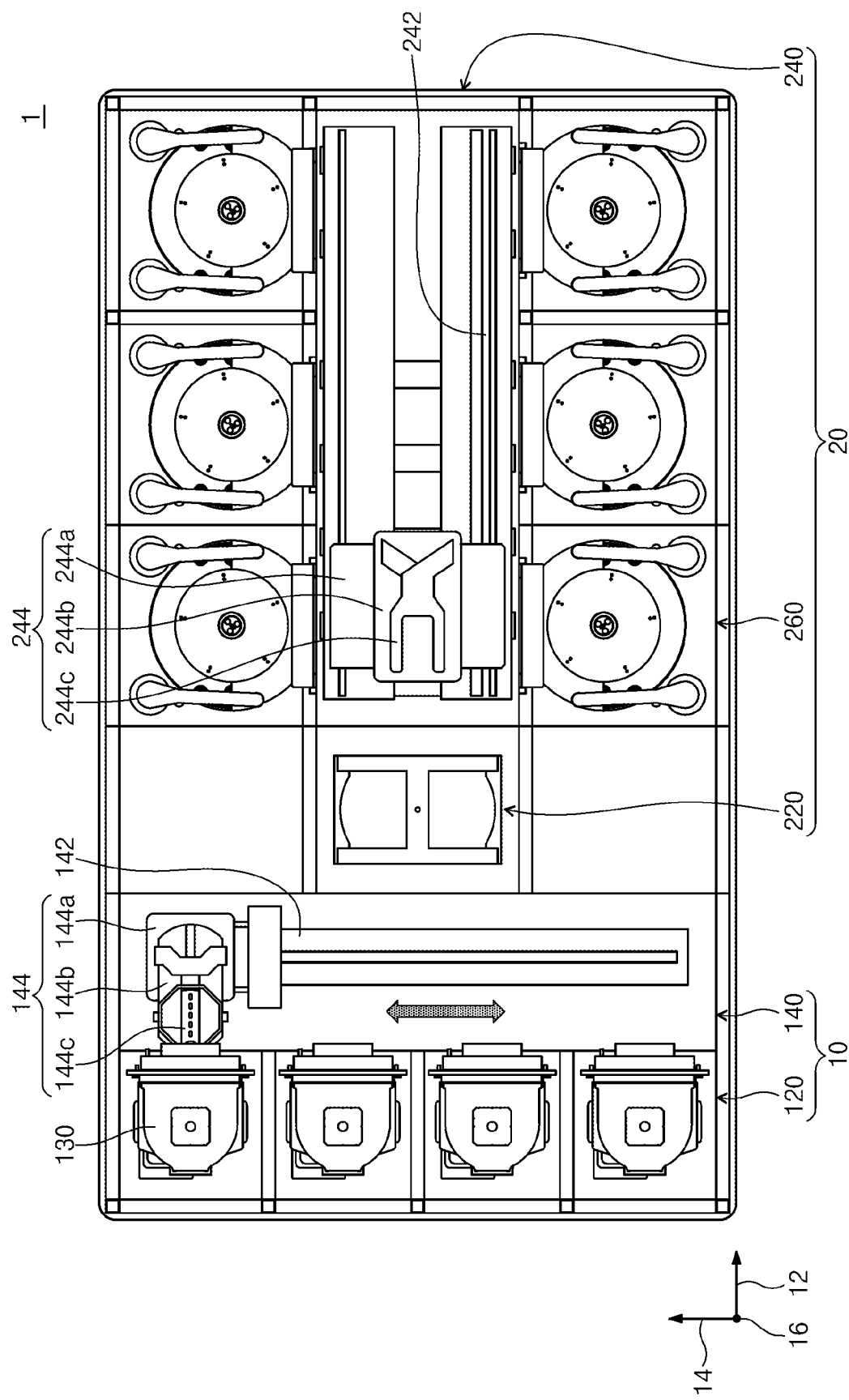
FIG. 1 is a plan view illustrating substrate treating equipment according to an embodiment of the inventive concept.

As the inventive concept allows for various changes and numerous embodiments, exemplary embodiments will be illustrated in the drawings and described in detail in the written description. However, this is not intended to limit the inventive concept to particular modes of practice, and it should be appreciated that all changes, equivalents, and substitutes that do not depart from the spirit and scope of the inventive concept are encompassed in the inventive concept. In describing the inventive concept, detailed descriptions related to well-known functions or configurations will be omitted when they may make subject matters of the inventive concept obscure.

The terminology used herein is for the purpose of describing particular embodiments only and is not intended to limit the scope of the inventive concept. The terms of a singular form may include plural forms unless otherwise specified. It should be understood that terms such as "comprise", "include", and "have", when used herein, specify the presence of stated features, numbers, steps, operations, components, parts, or combinations thereof, but do not preclude the presence or addition of one or more other features, numbers, steps, operations, components, parts, or combinations thereof.

The terms such as first, second, and the like may be used to describe various components, but the components should not be limited by the terms. The terms may be used only for distinguishing one component from others.

Hereinafter, embodiments according to the inventive concept will be described in detail with reference to the accompanying drawings. In describing the embodiments with reference to the accompanying drawings, identical or corresponding components are provided with identical reference numerals in the drawings regardless of the reference numerals, and repetitive descriptions thereof will be omitted.

FIG. 1 is a plan view illustrating substrate treating equipment according to an embodiment of the inventive concept.

Referring to FIG. 1, the substrate treating equipment 1 includes an index module 10 and a process module 20. The index module 10 includes load ports 120 and a transfer frame 140. The load ports 120, the transfer frame 140, and the process module 20 are sequentially arranged in a row. Hereinafter, the direction in which the load ports 120, the transfer frame 140, and the process module 20 are arranged is referred to as a first direction 12. A direction perpendicular to the first direction 12 when viewed from above is referred to as a second direction 14, and a direction perpendicular to the plane including the first direction 12 and the second direction 14 is referred to as a third direction 16.

Carriers 130, each of which has substrates W received therein, are placed on the load ports 120. The load ports 120 are arranged in a row along the second direction 14. FIG. 1 illustrates an example that the index module 10 includes four load ports 120. However, the number of load ports 120 may be increased or decreased depending on conditions such as the process efficiency and footprint of the process module 20. Each of the carriers 130 has slots (not illustrated) that are formed therein to support the edges of the substrates W. The slots (not illustrated) are arranged in the third direction 16, and the substrates W are stacked one above another with a spacing gap therebetween in the carrier 130 along the third direction 16. A front opening unified pod (FOUP) may be used as the carrier 130.

The process module 20 includes a buffer unit 220, a transfer chamber 240, and process chambers 260. The transfer chamber 240 is arranged such that the lengthwise direction thereof is parallel to the first direction 12. The process chambers 260 are disposed on one side and an opposite side of the transfer chamber 240 along the second direction 14. The process chambers 260 on the one side of the transfer chamber 240 and the process chambers 260 on the opposite side of the transfer chamber 240 are located in a symmetric arrangement with respect to the transfer chamber 240. Some of the process chambers 260 are arranged along the lengthwise direction of the transfer chamber 240. Furthermore, other process chambers 260 are stacked one above another. That is, the process chambers 260 may be arranged in an A×B array (A and B being natural numbers of 1 or larger) on the one side of the transfer chamber 240. Here, "A" is the number of process chambers 260 arranged in a row along the first direction 12, and "B" is the number of process chambers 260 arranged in a column along the third direction 16. In the case where four or six process chambers 260 are provided on the one side of the transfer chamber 240, the process chambers 260 may be arranged in a 2×2 or 3×2 array. The number of process chambers 260 may be increased or decreased. Alternatively, the process chambers 260 may be provided on only the one side of the transfer chamber 240. In another case, the process chambers 260 may be provided in a single layer on the one side and the opposite side of the transfer chamber 240.

The buffer unit 220 is disposed between the transfer frame 140 and the transfer chamber 240. The buffer unit 220 provides a space in which the substrates W stay before transferred between the transfer chamber 240 and the transfer frame 140. The buffer unit 220 has slots (not illustrated) therein, in which the substrates W are placed. The slots (not illustrated) are spaced apart from each other along the third direction 16. The buffer unit 220 is open at one side facing the transfer frame 140 and at an opposite side facing the transfer chamber 240.

The transfer frame 140 transfers the substrates W between the carriers 130 placed on the load ports 120 and the buffer unit 220. An index rail 142 and an index robot 144 are provided in the transfer frame 140. The index rail 142 is arranged such that the lengthwise direction thereof is parallel to the second direction 14. The index robot 144 is installed on the index rail 142 and rectilinearly moves along the index rail 142 in the second direction 14. The index robot 144 includes a base 144*a*, a body 144*b*, and index arms 144*c*. The base 144*a* is installed to be movable along the index rail 142. The body 144*b* is combined with the base 144*a*. The body 144*b* is movable on the base 144*a* along the third direction 16. Furthermore, the body 144*b* is rotatable on the base 144*a*. The index arms 144*c* are coupled to the body 144*b* and are movable forward and backward relative to the body 144*b*. The index arms 144*c* may individually operate. The index arms 144*c* are stacked one above another with a spacing gap therebetween along the third direction 16. Some of the index arms 144*c* may be used to transfer the substrates W from the process module 20 to the carriers 130, and the other index arms 144*c* may be used to transfer the substrates W from the carriers 130 to the process module 20. Accordingly, particles generated from the substrates W that are to be treated may be prevented from adhering to the treated substrates W in the process in which the index robot 144 transfers the substrates W between the carriers 130 and the process module 20.

The transfer chamber 240 transfers the substrates W between the buffer unit 220 and the process chambers 260 and between the process chambers 260. A guide rail 242 and a main robot 244 are provided in the transfer chamber 240. The guide rail 242 is arranged such that the lengthwise direction thereof is parallel to the first direction 12. The main robot 244 is installed on the guide rail 242 and rectilinearly moves on the guide rail 242 along the first direction 12. The main robot 244 includes a base 244a, a body 244b, and main arms 244c. The base 244a is installed to be movable along the guide rail 242. The body 244b is combined with the base 244a. The body 244b is movable on the base 244a along the third direction 16. Furthermore, the body 244b is rotatable on the base 244a. The main arms 244c are coupled to the body 244b and are movable forward and backward relative to the body 244b. The main arms 244c may individually operate. The main arms 244c are stacked one above another with a spacing gap therebetween along the third direction 16. The main arms 244c used to transfer the substrates W from the buffer unit 220 to the process chambers 260 may differ from the main arms 244c used to transfer the substrates W from the process chambers 260 to the buffer unit 220.

Each of the process chambers 260 includes a substrate treating apparatus 300 therein, in which a cleaning process is performed on a substrate W. The substrate treating apparatuses 300 provided in the respective process chambers 260 may have different structures depending on the types of cleaning processes performed by the substrate treating apparatuses 300. Alternatively, the substrate treating apparatuses 300 in the respective process chambers 260 may have the same structure. In another case, the process chambers 260 may be classified into a plurality groups. The substrate treating apparatuses 300 in the process chambers 260 belonging to the same group may have the same structure, and the substrate treating apparatuses 300 in the process chambers 260 belonging to different groups may have different structures. For example, in the case where the process chambers 260 are classified into two groups, a first group of process chambers 260 may be provided on the one side of the transfer chamber 240, and a second group of process chambers 260 may be provided on the opposite side of the transfer chamber 240. Alternatively, on the opposite sides of the transfer chamber 240, the first group of process chambers 260 may be provided in a lower layer, and the second group of process chambers 260 may be provided in an upper layer. The first group of process chambers 260 may be distinguished from the second group of process chambers 260 depending on the types of chemicals used and the types of cleaning processes.

Hereinafter, an example of the substrate treating apparatus 300 that cleans the substrate W with processing liquids will be described.

Figure 2:
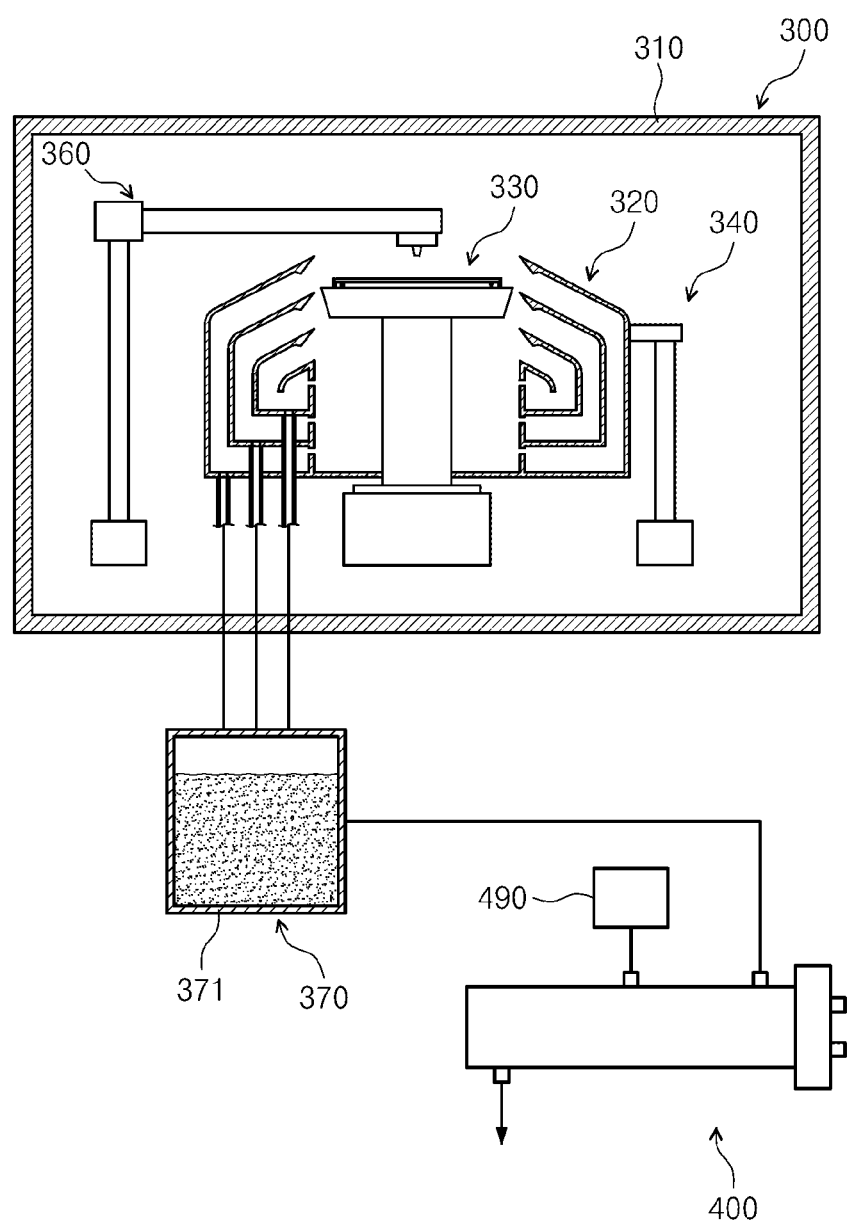
FIG. 2 is a schematic view illustrating a configuration of a substrate treating apparatus provided in a process chamber of FIG. 1.
Figure 3:
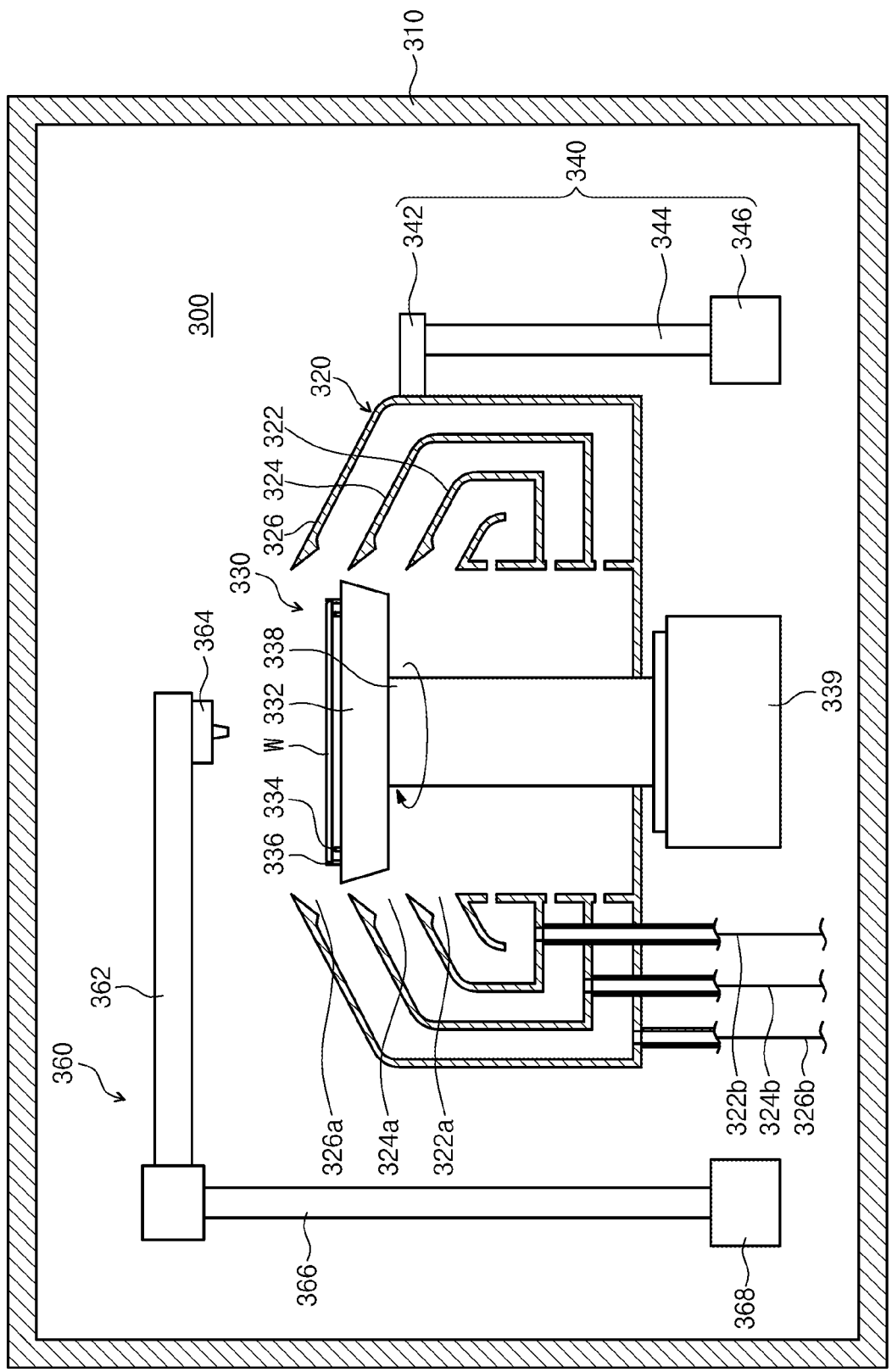
FIG. 3 is a sectional view illustrating the substrate treating apparatus provided in the process chamber of FIG. 1.

FIG. 2 is a schematic view illustrating a configuration of the substrate treating apparatus provided in the process chamber of FIG. 1. FIG. 3 is a sectional view illustrating the substrate treating apparatus provided in the process chamber of FIG. 1.

Referring to FIGS. 2 and 3, the substrate treating apparatus 300 includes a chamber 310, a cup 320, a support unit 330, a lifting unit 340, a liquid dispensing unit 360, a liquid drain unit 370, and a dissolved ozone removal unit 400.

The chamber 310 has a space therein. The cup 320 is located in the chamber 310.

The cup 320 provides a process space in which a substrate treating process is performed. The cup 320 has a shape that is open at the top. The cup 320 includes an inner recovery bowl 322, an intermediate recovery bowl 324, and an outer recovery bowl 326. The recovery bowls 322, 324, and 326 recover different processing liquids used in the substrate treating process. The inner recovery bowl 322 has an annular ring shape that surrounds the support unit 330. The intermediate recovery bowl 324 has an annular ring shape that surrounds the inner recovery bowl 322. The outer recovery bowl 326 has an annular ring shape that surrounds the intermediate recovery bowl 324. An interior space 322a of the inner recovery bowl 322, a space 324a between the inner recovery bowl 322 and the intermediate recovery bowl 324, and a space 326a between the intermediate recovery bowl 324 and the outer recovery bowl 326 function as inlets through which the processing liquids are introduced into the inner recovery bowl 322, the intermediate recovery bowl 324, and the outer recovery bowl 326. The recovery bowls 322, 324, and 326 have recovery lines 322b, 324b, and 326b connected thereto, respectively. The recovery lines 322b, 324b, and 326b vertically extend downward from the bottoms of the recovery bowls 322, 324, and 326. The recovery lines 322b, 324b, and 326b drain the processing liquids introduced into the recovery bowls 322, 324, and 326, respectively. The drained processing liquids may be reused through an external processing liquid regeneration system (not illustrated).

The support unit 330 is disposed in the cup 320. The support unit 330 supports and rotates the substrate W during the substrate treating process. The support unit 330 includes a body 332, a support pin 334, a chuck pin 336, and a support shaft 338. The body 332 has an upper surface in a substantially circular shape when viewed from above. The support shaft 338 that is rotatable by a motor 339 is fixedly coupled to a bottom surface of the body 332. The support pin 334 includes a plurality of support pins 334. The support pins 334 are disposed to be spaced apart from each other on an edge portion of the upper surface of the body 332. The support pins 334 protrude upward from the body 332. The support pins 334 are arranged to have an annular ring shape as a whole by a combination thereof. The support pins 334 support the edge of the backside of the substrate W such that the substrate W is spaced apart from the upper surface of the body 332 by a predetermined distance.

The chuck pin 336 includes a plurality of chuck pins 336. The chuck pins 336 are located farther away from the center of the body 332 than the support pins 334. The chuck pins 336 protrude upward from the body 332. The chuck pins 336 support the side of the substrate W to prevent the substrate W from deviating from the correct position to a side when the support unit 330 rotates. The chuck pins 336 are rectilinearly movable between a standby position and a support position along the radial direction of the body 332. The standby position is a position farther away from the center of the body 332 than the support position. The chuck pins 336 are located in the standby position when the substrate W is loaded onto or unloaded from the support unit 330, and the chuck pins 336 are located in the support position when the substrate treating process is performed on the substrate W. In the support position, the chuck pins 336 are brought into contact with the side of the substrate W.

The lifting unit 340 rectilinearly moves the cup 320 in the vertical direction. As the cup 320 is vertically moved, the height of the cup 320 relative to the support unit 330 is varied. The lifting unit 340 includes a bracket 342, a movable shaft 344, and an actuator 346.

The bracket 342 is fixedly attached to the outer wall of the cup 320. The movable shaft 344 is fixedly coupled to the bracket 342 and vertically moved by the actuator 346. When the substrate W is placed on the support unit 330 or lifted upward from the support unit 330, the cup 320 is moved downward to cause the support unit 330 to protrude above the cup 320. Furthermore, when the substrate treating process is performed, the height of the cup 320 is adjusted depending on the types of processing liquids, which are dispensed onto the substrate W, to cause the processing liquids to be introduced into the preset recovery bowls 322, 324, and 326.

For example, while the substrate W is treated with a first processing liquid, the substrate W is located at the height corresponding to the interior space 322a of the inner recovery bowl 322. Furthermore, while the substrate W is treated with a second processing liquid, the substrate W may be located at the height corresponding to the space 324a between the inner recovery bowl 322 and the intermediate recovery bowl 324, and while the substrate W is treated with a third processing liquid, the substrate W may be located at the height corresponding to the space 326a between the intermediate recovery bowl 324 and the outer recovery bowl 326. Alternatively, the lifting unit 340 may vertically move the support unit 330 instead of the cup 320.

The liquid dispensing unit 360 dispenses a processing liquid onto the substrate W during the substrate treating process. For example, the processing liquid supplied may be a processing liquid containing ozone water. For example, the amount of dissolved ozone contained in the processing liquid may be 30 ppm or 80 ppm. Alternatively, the amount of dissolved ozone in the processing liquid may be 80 ppm or more. The amount of dissolved ozone in the processing liquid may be differently set depending on the type of film formed on the substrate W.

The liquid dispensing unit 360 includes a nozzle support rod 362, a nozzle 364, a support shaft 366, and an actuator 368.

The support shaft 366 is arranged such that the lengthwise direction thereof is parallel to the third direction 16, and the actuator 368 is coupled to a lower end of the support shaft 366. The actuator 368 rotates, raises, and lowers the support shaft 366. The nozzle support rod 362 is coupled perpendicular to an upper end of the support shaft 366 that is opposite to the lower end of the support shaft 366 to which the actuator 388 is coupled. The nozzle 364 is mounted on a bottom surface of a distal end of the nozzle support rod 382. The nozzle 364 is moved between a process position and a standby position by the actuator 368. The process position is a position where the nozzle 364 is located directly above the cup 320, and the standby position is a position where the nozzle 364 deviates from directly above the cup 320. The nozzle 364 dispenses a liquid onto the substrate W.

One or more liquid dispensing units 360 may be provided. In the case where a plurality of liquid dispensing units 360 are provided, a processing liquid containing ozone water, a chemical, a rinsing solution, and an organic solvent may be dispensed by the different liquid dispensing units 360. The rinsing solution may be deionized water, and the organic solvent may be a mixture of isopropyl alcohol vapor and an inert gas, or an isopropyl alcohol solution.

The liquid drain unit 370 recovers a liquid after the liquid is dispensed onto the substrate W and used to treat the substrate W. The liquid drain unit 370 includes a drain tank 371. The drain tank 371 may have a cylindrical shape. The drain tank 371 may store the liquid used to treat the substrate W (e.g., a processing liquid in which ozone is dissolved).

The dissolved ozone removal unit 400 is connected with the liquid drain unit 370. The dissolved ozone removal unit 400 removes the dissolved ozone in the processing liquid supplied from the liquid drain unit 370.

Figure 4:
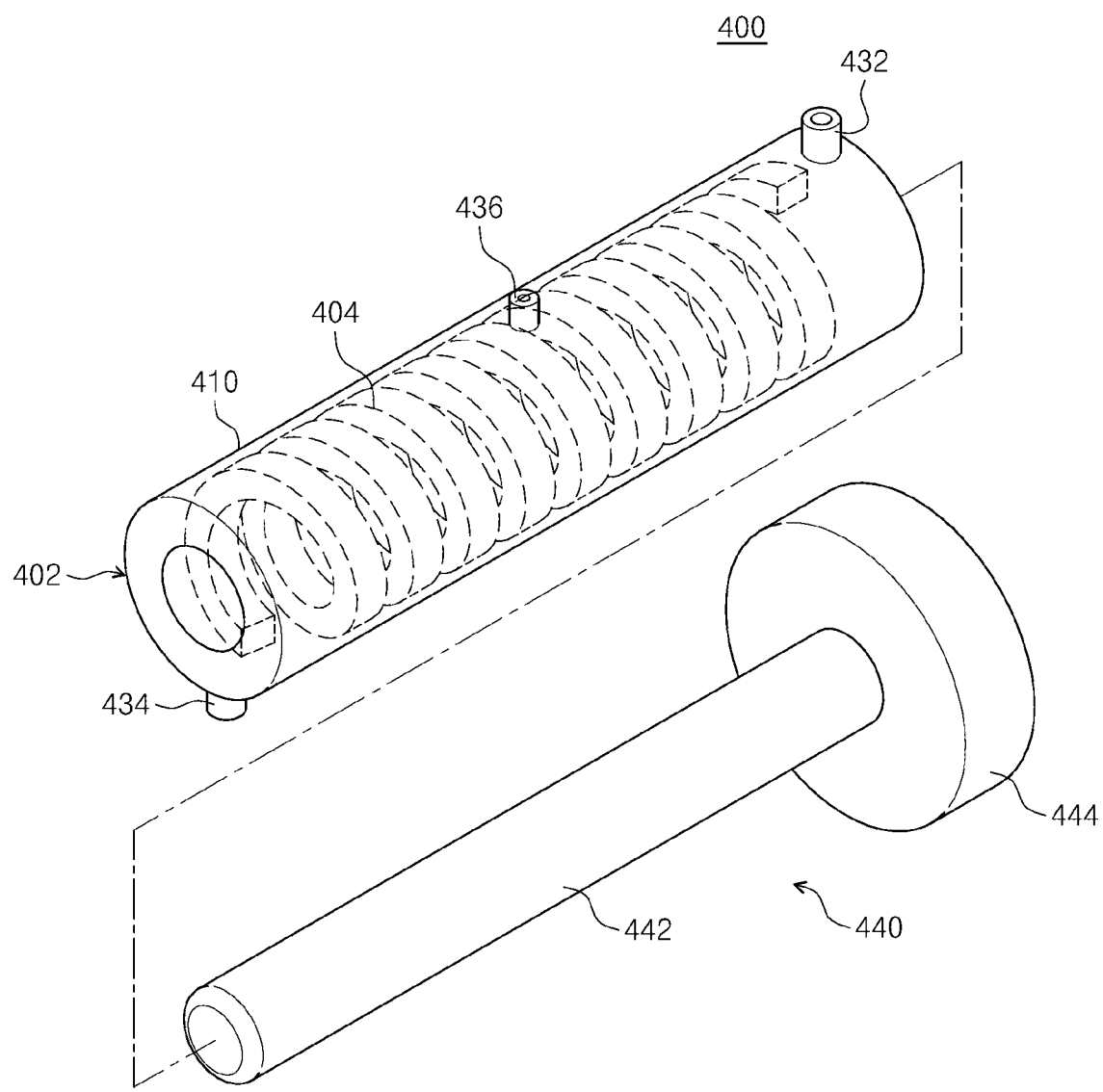
FIG. 4 is an exploded perspective view illustrating a dissolved ozone removal unit according to a first embodiment of the inventive concept.
Figure 5:
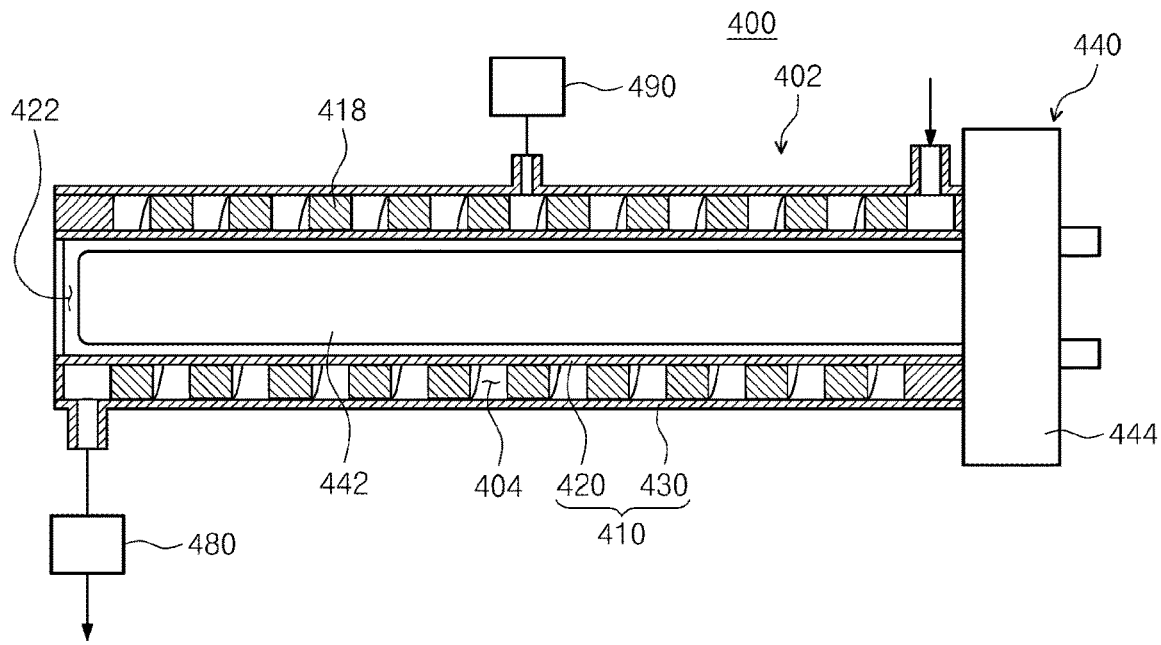
FIG. 5 is a sectional view of the dissolved ozone removal unit.
Figure 6:
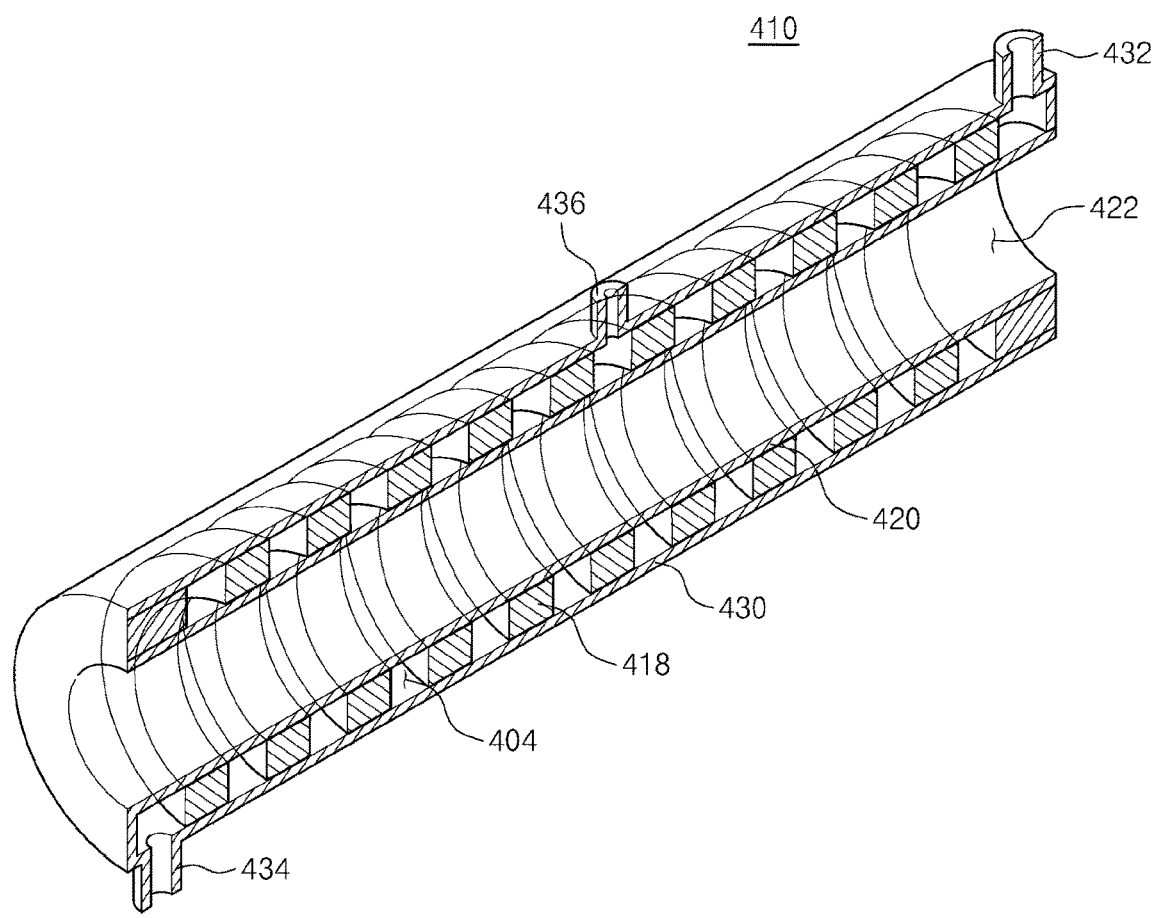
FIG. 6 is a sectional perspective view of a housing.

FIG. 4 is an exploded perspective view illustrating a dissolved ozone removal unit according to a first embodiment of the inventive concept. FIG. 5 is a sectional view of the dissolved ozone removal unit. FIG. 6 is a sectional perspective view of a housing of the dissolved ozone removal unit.

Referring to FIGS. 4 to 6, the dissolved ozone removal unit 400 may include a fluid channel providing member 402, a light source member 440, a measurement member 480, and a gas decomposition member 490.

The fluid channel providing member 402 may provide a fluid channel through which a processing liquid passes. The fluid channel providing member 402 may include a helical fluid channel 404 that is configured such that the processing liquid is exposed to UV light while helically moving around the light source member 440.

For example, the fluid channel providing member 402 may include the cylindrical housing 410 that includes an inner cylinder 420 and an outer cylinder 430. The housing 410 may be installed such that the lengthwise direction thereof is parallel to the horizontal direction. The inner cylinder 420 may surround the light source member 440. The inner cylinder 420 may provide an interior space (a receiving space) 422 in which the light source member 440 is received. The housing 410 may be open at one end thereof so as to connect to the receiving space 422 of the inner cylinder 420. The outer cylinder 430 may be coaxially disposed outside the inner cylinder 420 such that the helical fluid channel 404 is provided between the inner cylinder 420 and the outer cylinder 430.

The housing 410 may include a helical blade 418 mounted between the inner cylinder 420 and the outer cylinder 430. The helical fluid channel 404 is formed by air-tightly coupling the outer diameter surface of the helical blade 418 to the inner diameter surface of the outer cylinder 430 and air-tightly coupling the inner diameter surface of the helical blade 418 to the outer diameter surface of the inner cylinder 420. The inner cylinder 420 and the helical blade 418 are preferably formed of a UV-transmitting material through which UV light is able to pass.

Figure 13:
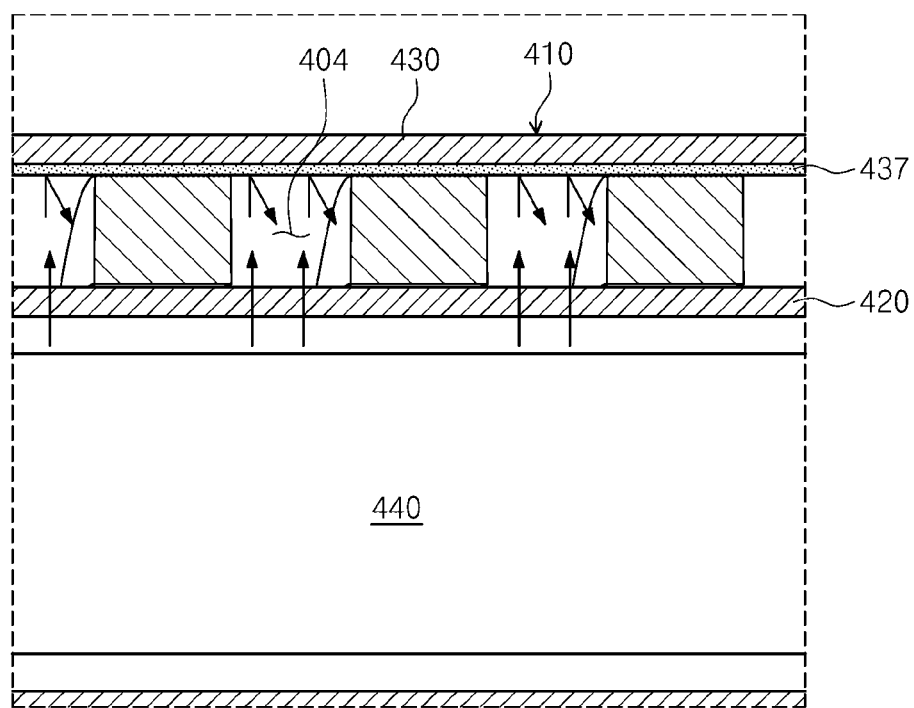
FIG. 13 is a view illustrating the housing having a reflective layer.

Meanwhile, as illustrated in FIG. 13, the outer cylinder 430 may include, on the inner diameter surface thereof, a reflective layer (a reflective sheet) 437 that reflects UV light. In this case, the irradiation rate of UV light applied to the processing liquid flowing through the helical fluid channel 404 may be raised, which results in an improvement in ozone removal efficiency.

The housing 410 may include an inlet port 432, an outlet port 434, and an exhaust port 436. The inlet port 432 corresponds to an inlet through which the processing liquid is introduced into the helical fluid channel 404 from the outside (the drain tank 371). The inlet port 432 may be located at one end of the outer cylinder 430 and may be provided in a direction perpendicular to the lengthwise direction of the outer cylinder 430. The outlet port 434 corresponds to an outlet through which the processing liquid from which dissolved ozone is removed is drained from the helical fluid channel 404. The outlet port 434 may be located at an opposite end of the outer cylinder 430 and may be provided in the direction perpendicular to the lengthwise direction of the outer cylinder 430. The inlet port 432 may preferably be located on an upper side of the outer cylinder 430, and the outlet port 434 may preferably be located on a lower side of the outer cylinder 430. The processing liquid introduced through the inlet port 432 may be naturally drained through the outlet port 434 after passing through the helical fluid channel 404 by the gravity.

The housing 410 has, on an upper central portion thereof, the exhaust port 436 through which removed ozone gas is released. The exhaust port 436 is located on an upper central portion of the outer cylinder 430. The ozone gas released through the exhaust port 436 may be separately discharged through a collection apparatus. The collection apparatus may include the gas decomposition member 490. The gas decomposition member 490 decomposes the ozone gas released through the exhaust port 436.

The measurement member 480 measures the amount of dissolved ozone in the processing liquid drained through the outlet port 434. The measurement value measured by the measurement member 480 may be provided to a controller (not illustrated) for adjustment of the amount of ozone wastewater. Furthermore, when the amount of dissolved ozone in the processing liquid is above a set range, the measurement member 480 may send a signal to an alarm member (not illustrate), which is connected with the measurement member 480, to inform an operator that the amount of dissolved ozone in the processing liquid exceeds the set range.

The light source member 440 supplies light to the processing liquid flowing through the helical fluid channel 404. For example, the light source member 440 may supply UV light to the processing liquid. The light source member 440 may be detachably mounted in the receiving space 422 of the inner cylinder 420. For example, the light source member 440 may be implemented with a UV lamp. The light emitted from the UV lamp may have a wavelength of 254 nm.

The light source member 440 may include a lamp tube 442 that is located in the receiving space 422 of the inner cylinder 420 through the open one end of the housing 410. The lamp tube 442 may include one end portion that is closed and an opposite end portion that is air-tightly coupled to a rear cap 444.

As described above, the light source member 440 may be detachably mounted in the receiving space 422 formed in the middle of the housing 410 and therefore may not make direct contact with the processing liquid. Accordingly, the maintenance (replacement) of the light source member 440 may be easily performed, and the light source member 440 may be prevented from being contaminated or corroded by the processing liquid.

First Modified Embodiment

Figure 7:
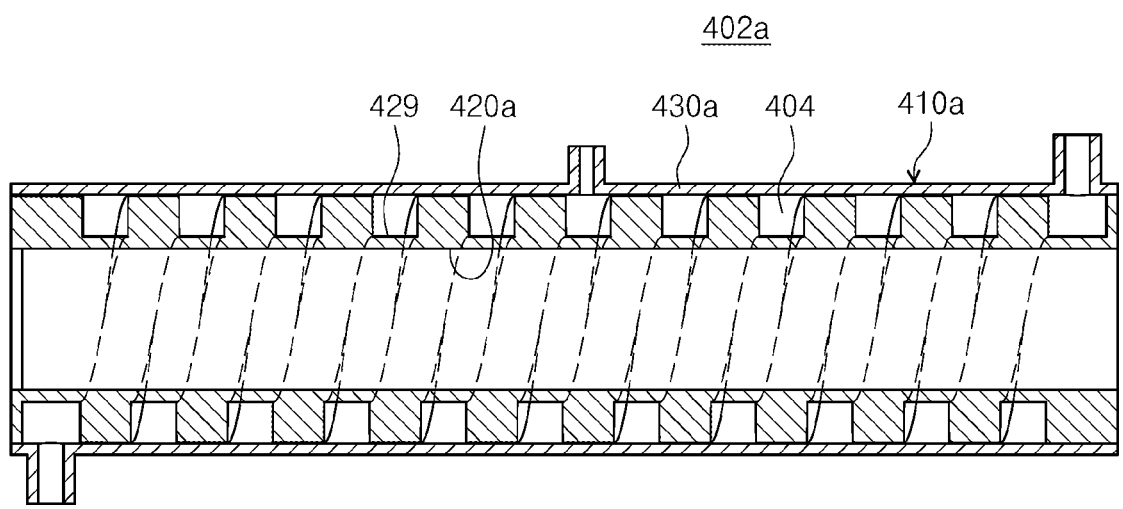
FIG. 7 is a view illustrating a first modified embodiment of a fluid channel providing member according to the inventive concept.

FIG. 7 is a view illustrating the first modified embodiment of the fluid channel providing member according to the inventive concept.

Referring to FIG. 7, the fluid channel providing member 402a according to the first modified embodiment includes a cylindrical housing 410a including an inner cylinder 420a and an outer cylinder 430a. The housing 410a has a configuration and a function substantially similar to those of the housing 410 including the inner cylinder 420 and the outer cylinder 430 illustrated in FIG. 5. Therefore, the following description is focused on the difference therebetween.

The housing 410a differs from the housing 410 in that a helical fluid channel 404 in this modified embodiment, which is provided between the inner cylinder 420a and the outer cylinder 430a, is implemented with a helical groove 429 formed on the outer diameter surface of the inner cylinder 420a. The helical fluid channel 404 according to this modified embodiment has an advantage in that the helical fluid channel 404 is able to be more easily manufactured than the helical fluid channel illustrated in FIG. 5.

Second Modified Embodiment

Figure 8:
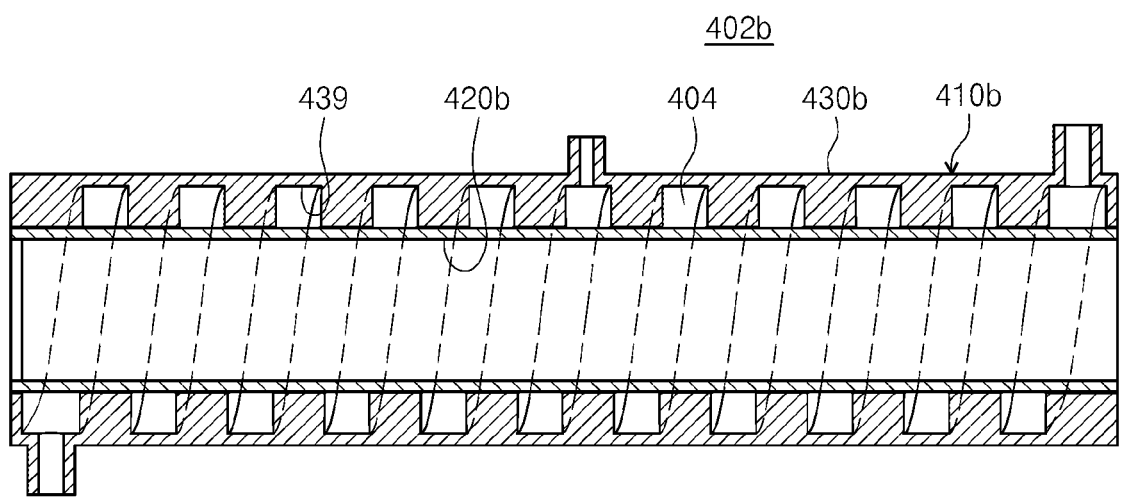
FIG. 8 is a view illustrating a second modified embodiment of the fluid channel providing member according to the inventive concept.

FIG. 8 is a view illustrating the second modified embodiment of the fluid channel providing member according to the inventive concept.

Referring to FIG. 8, the fluid channel providing member 402b according to the second modified embodiment includes a cylindrical housing 410b including an inner cylinder 420b and an outer cylinder 430b. The housing 410b has a configuration and a function substantially similar to those of the housing 410a including the inner cylinder 420a and the outer cylinder 430a illustrated in FIG. 7. Therefore, the following description is focused on the difference therebetween.

The housing 410b differs from the housing 410a in that a helical fluid channel 404 in this modified embodiment, which is provided between the inner cylinder 420b and the outer cylinder 430b, is implemented with a helical groove 439 formed on the inner diameter surface of the outer cylinder 430b. The helical fluid channel 404 according to this modified embodiment has an advantage in that the helical fluid channel 404 is able to be more easily manufactured than the helical fluid channel illustrated in FIG. 5.

Third Modified Embodiment

Figure 9:
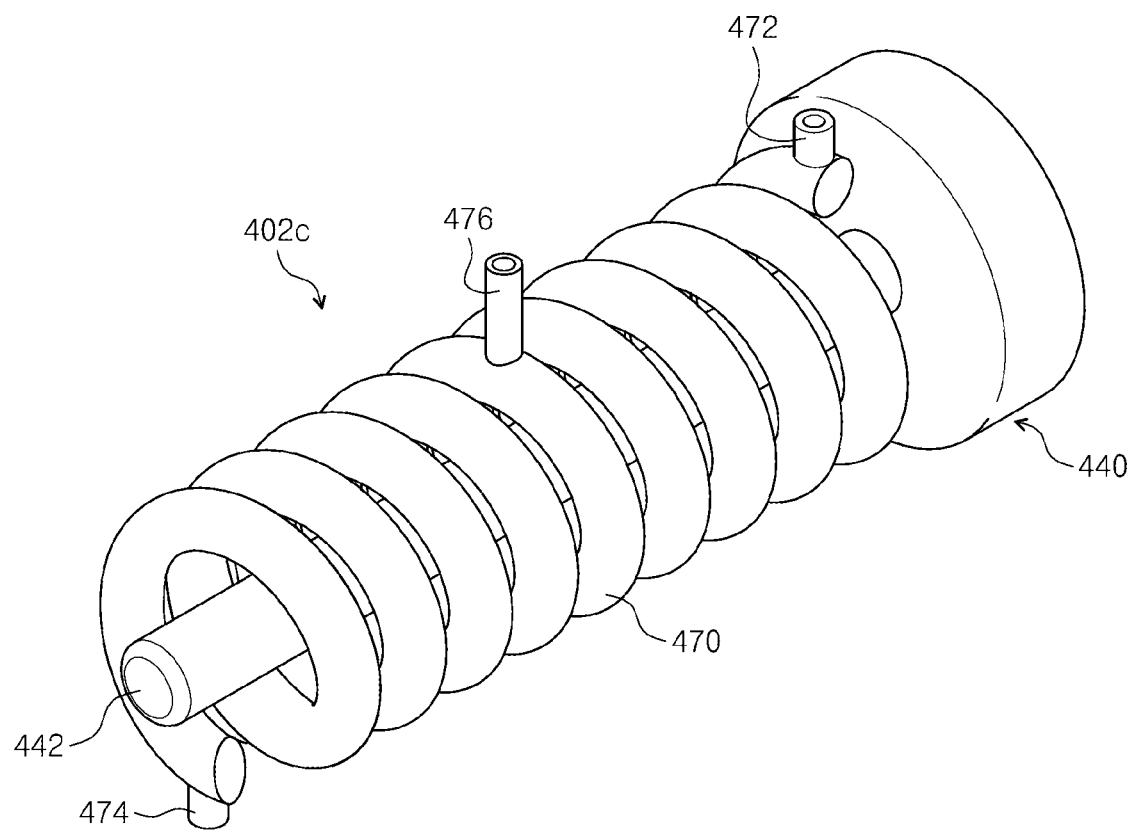
FIG. 9 is a view illustrating a third modified embodiment of the fluid channel providing member according to the inventive concept.

FIG. 9 is a perspective view illustrating a fluid channel providing member according to the third modified embodiment of the inventive concept.

Referring to FIG. 9, the fluid channel providing member 402c according to the third modified embodiment may be implemented with a tube member 470 that is helically wound around the lamp tube 442 of the light source member 440 to provide a helical fluid channel. The tube member 470 may be formed of a UV-transmitting material.

Meanwhile, the tube member 470 includes an inlet port 472, an outlet port 474, and an exhaust port 476. The inlet port 472, the outlet port 474, and the exhaust port 476 have configurations and functions similar to those of the inlet port 432, the outlet port 434, and the exhaust port 436 illustrated in FIG. 5. Therefore, detailed descriptions thereabout will be omitted.

Fourth Modified Embodiment

Figure 10:
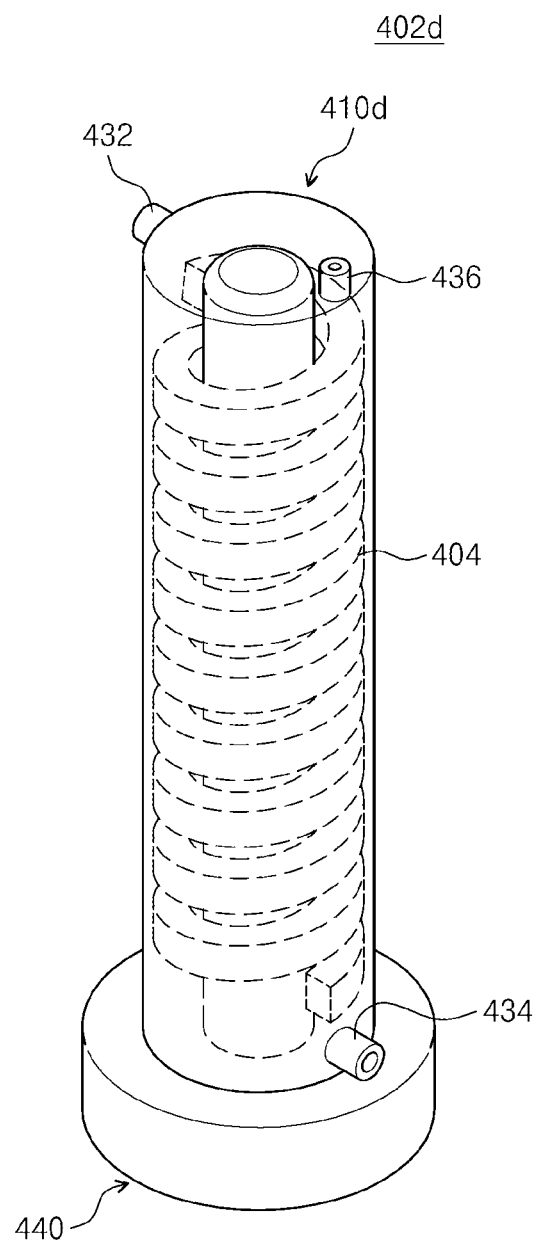
FIGS. 10 and 11 are views illustrating a fourth modified embodiment of the fluid channel providing member according to the inventive concept.
Figure 11:
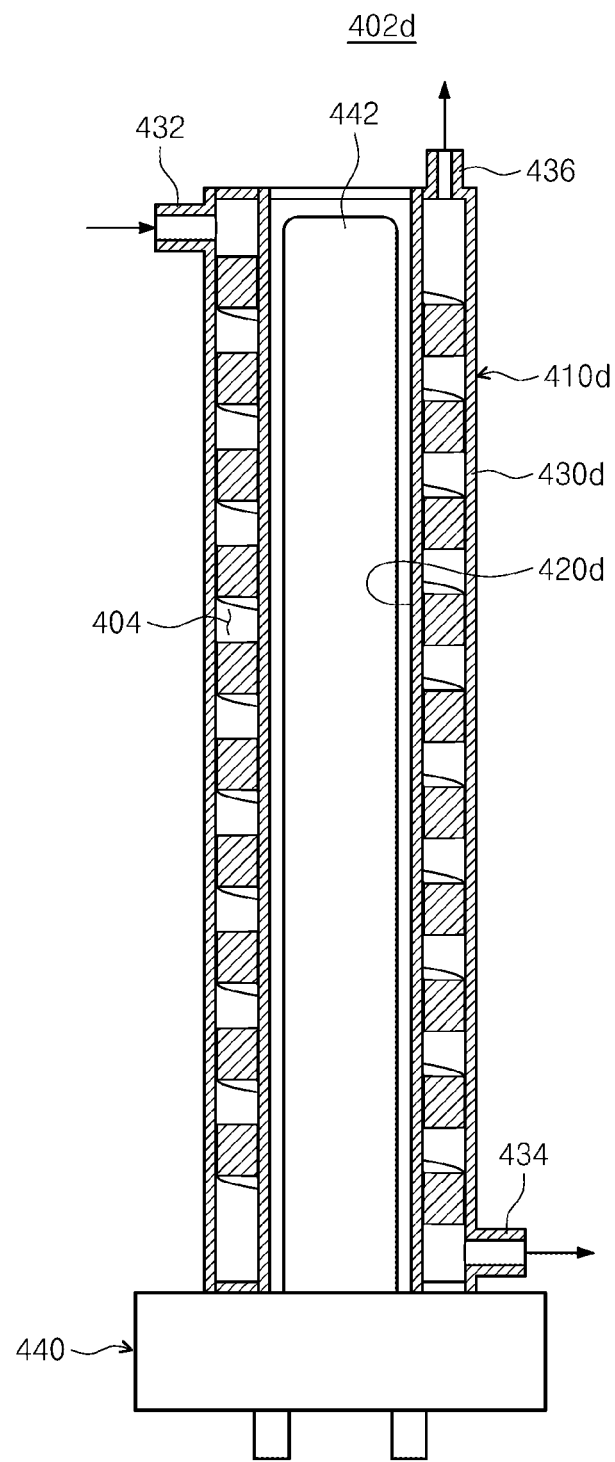

FIGS. 10 and 11 are a perspective view and a sectional view illustrating a fluid channel providing member according to the fourth modified embodiment of the inventive concept.

Referring to FIGS. 10 and 11, the fluid channel providing member 402d according to the fourth modified embodiment includes a cylindrical housing 410d including an inner cylinder 420d and an outer cylinder 430d. The housing 410d has a configuration and a function substantially similar to those of the housing 410 including the inner cylinder 420 and the outer cylinder 430 illustrated in FIG. 5. Therefore, the following description is focused on the difference therebetween.

In this modified embodiment, the housing 410d is characterized by being vertically disposed. The housing 410d differs from the housing 410 in that a processing liquid flowing through a helical fluid channel of the housing 410d disposed in the vertical position is able to more smoothly flow than a processing liquid flowing through the helical fluid channel of the housing 410 disposed in the horizontal position. In the case where the housing 410d is vertically disposed, an exhaust port 436 is preferably disposed at the top of the housing 410d.

Second Embodiment

Figure 12:
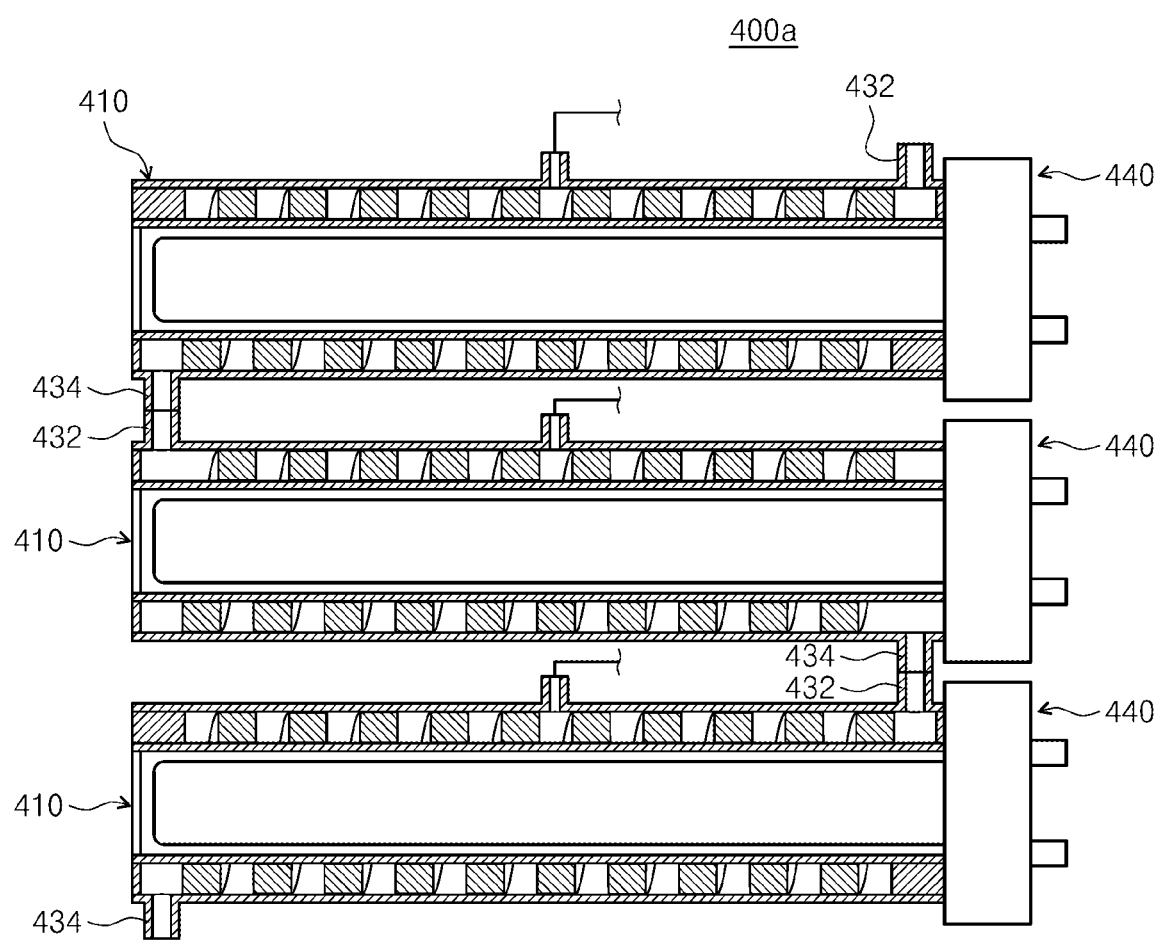
FIG. 12 is a view illustrating a dissolved ozone removal unit according to a second embodiment of the inventive concept.

FIG. 12 is a view illustrating a dissolved ozone removal unit according to a second embodiment of the inventive concept.

Referring to FIG. 12, the dissolved ozone removal unit 400a may include a plurality of housings 410. The housings 410 may be arranged parallel to each other in a direction perpendicular to the lengthwise direction of the housings 410. The housings 410 may be connected together in series. In this embodiment, three housings 410 may be stacked one above another. The housings 410 may provide a serial fluid channel structure in which an outlet port 434 of the housing 410 disposed in a higher position is connected with an inlet port 432 of the housing 410 disposed in a lower position.

As described above, the dissolved ozone removal unit 400a includes the plurality of housings 410 configured in the in-line manner, thereby achieving minimization of time taken to treat a processing liquid, an improvement in productivity, and an improvement in ozone removal efficiency.

Hereinafter, a substrate treating method according to an embodiment of the inventive concept will be described.

In a process of treating a substrate, a processing liquid containing ozone water is dispensed onto the substrate. The processing liquid may react with a film formed on the substrate and may remove the film from the substrate. The processing liquid is recovered after the process of treating the substrate is completely performed. The recovered processing liquid is supplied to the dissolved ozone removal unit 400. The dissolved ozone removal unit 400 removes the dissolved ozone in the processing liquid and discharges the removed ozone to the outside.

The removal of the dissolved ozone in the dissolved ozone removal unit 400 is performed by supplying UV light to the processing liquid by the light source member 440 and allowing the processing liquid to be exposed to the UV light while moving along the helical fluid channel 404. The dissolved ozone removed from the processing liquid is released through the exhaust port 436 connected to the helical fluid channel 404 and is separately discharged through the collection apparatus.

As described above, according to the embodiments of the inventive concept, the structure including the helical fluid channel, through which the processing liquid containing ozone (ozone water) used in the substrate treating apparatus flows, enables the dissolved ozone to be very efficiently removed from the processing liquid flowing through the helical fluid channel.

As described above, according to the embodiments of the inventive concept, the dissolved ozone removal unit supplies UV light to the processing liquid used in the substrate treating process, thereby effectively removing the dissolved ozone in the processing liquid.

Further, according to the embodiments of the inventive concept, the dissolved ozone removal unit removes the dissolved ozone in the processing liquid used in the substrate treating process, thereby preventing environmental pollution caused by the processing liquid.

Furthermore, according to the embodiments of the inventive concept, the dissolved ozone removal unit provides the flow path of the processing liquid in the helical form to increase the residence time of the processing liquid in the housing and maximize the amount of UV light supplied to the processing liquid, thereby achieving an improvement in ozone removal rate.

Moreover, according to the embodiments of the inventive concept, the light source member is detachably mounted in the receiving space formed in the middle of the housing and therefore does not make direct contact with the processing liquid. Accordingly, the maintenance (replacement) of the light source member may be easily performed, and the light source member may be prevented from being contaminated or corroded by the processing liquid.

In addition, according to the embodiments of the inventive concept, the dissolved ozone removal unit includes the plurality of housings configured in the in-line manner, thereby achieving minimization of time taken to treat the processing liquid, an improvement in productivity, and an improvement in ozone removal efficiency.

Effects of the inventive concept are not limited to the aforementioned effects, and any other effects not mentioned herein may be clearly understood from this specification and the accompanying drawings by those skilled in the art to which the inventive concept pertains.

The above description exemplifies the inventive concept. Furthermore, the above-mentioned contents describe the exemplary embodiments of the inventive concept, and the inventive concept may be used in various other combinations, changes, and environments. That is, variations or modifications can be made to the inventive concept without departing from the scope of the inventive concept that is disclosed in the specification, the equivalent scope to the written disclosures, and/or the technical or knowledge range of those skilled in the art. The written embodiments describe the best state for implementing the technical spirit of the inventive concept, and various changes required in specific applications and purposes of the inventive concept can be made. Accordingly, the detailed description of the inventive concept is not intended to restrict the inventive concept in the disclosed embodiment state. In addition, it should be construed that the attached claims include other embodiments.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A dissolved ozone removal unit for removing dissolved ozone contained in a processing liquid, the dissolved ozone removal unit comprising:
   a fluid channel providing member having a fluid channel through which the processing liquid passes; and
   a light source member mounted in the fluid channel providing member and configured to supply UV light to the processing liquid,
   wherein the fluid channel providing member includes:
      a housing including:
         an inner cylinder configured to surround the light source member,
         an outer cylinder coaxially disposed outside the inner cylinder,
         a helical blade mounted between the outer cylinder and the inner cylinder, and
         a helical fluid channel provided between the inner cylinder and the outer cylinder, the helical fluid channel configured such that the processing liquid is exposed to the UV light while helically moving around the light source member, wherein the helical fluid channel is formed by air-tightly coupling an outer diameter surface of the helical blade to an inner diameter surface of the outer cylinder and air-tightly coupling an inner diameter surface of the helical blade to an outer diameter surface of the inner cylinder, wherein the light source member is detachably mounted in a receiving space in a middle of the fluid channel providing member so as not to make direct contact with the processing liquid, wherein the housing further includes an exhaust tube through which removed ozone gas is released from the helical fluid channel, and wherein the exhaust tube extends to an area of the helical fluid channel that is confined by the inner cylinder, the outer cylinder, and adjacent fins of the helical blade.

2. A dissolved ozone removal unit for removing dissolved ozone contained in a processing liquid, the dissolved ozone removal unit comprising:

a fluid channel providing member having a fluid channel through which the processing liquid passes; and a light source member mounted in the fluid channel providing member and configured to supply UV light to the processing liquid, wherein the fluid channel providing member includes:
a housing including:
an inner cylinder configured to surround the light source member,
an outer cylinder coaxially disposed outside the inner cylinder, and
a helical blade mounted between the outer cylinder and the inner cylinder; and
a helical fluid channel provided between the inner cylinder and the outer cylinder, the helical fluid channel configured such that the processing liquid is exposed to the UV light while helically moving around the light source member, wherein the helical fluid channel includes a helical groove formed on:
an outer diameter surface of the inner cylinder, or
an inner diameter surface of the outer cylinder, wherein the outer diameter surface of the inner cylinder is air-tightly coupled to the inner diameter surface of the outer cylinder, wherein the housing further includes an exhaust tube through which removed ozone gas is released from the helical fluid channel, and wherein the exhaust tube extends to an area of the helical fluid channel that is confined by the inner cylinder, the outer cylinder, and adjacent fins of the helical blade.

3. The dissolved ozone removal unit of claim 1, wherein the housing is open at one end thereof so as to connect to a receiving space of the inner cylinder, and wherein the light source member includes a lamp tube located in the receiving space of the inner cylinder through the open one end of the housing.

4. The dissolved ozone removal unit of claim 1, wherein the housing is formed of a UV-transmitting material.

5. The dissolved ozone removal unit of claim 1, wherein the housing further includes:

an inlet port provided at one end of the housing in a direction perpendicular to a lengthwise direction of the outer cylinder, wherein the processing liquid is introduced into the helical fluid channel from an outside through the inlet port; and an outlet port provided at an opposite end of the housing in the direction perpendicular to the lengthwise direction of the outer cylinder, wherein the processing liquid from which the dissolved ozone is removed is drained from the helical fluid channel through the outlet port.

6. The dissolved ozone removal unit of claim 5, wherein the exhaust tube is located on an upper side of the housing.

7. The dissolved ozone removal unit of claim 6, wherein the dissolved ozone removal unit further comprises a gas decomposition member connected with the exhaust tube and configured to decompose the ozone gas.

8. The dissolved ozone removal unit of claim 5, wherein the housing is disposed in a vertical position such that the one end of the housing at which the inlet port is located is directed toward an upper direction.

9. The dissolved ozone removal unit of claim 1, wherein the housing is disposed in a horizontal position.

10. The dissolved ozone removal unit of claim 1, wherein the housing includes at least two housings stacked one above another, and wherein the fluid channel providing member provides a serial fluid channel structure in which an outlet port of a housing disposed in a higher position among the at least two housings is connected with an inlet port of a housing disposed in a lower position.

11. The dissolved ozone removal unit of claim 1, wherein the light source member includes a lamp tube having one end portion that is closed and an opposite end portion that is air-tightly coupled to a rear cap.

12. The dissolved ozone removal unit of claim 1, wherein the light source member includes one or more UV lamps.

13. The dissolved ozone removal unit of claim 5, wherein the dissolved ozone removal unit further comprises a measurement member installed at the outlet port and configured to measure an amount of the dissolved ozone in the processing liquid.

14. An apparatus for treating a substrate, the apparatus comprising:

a cup having a process space therein;

a support unit configured to support the substrate in the process space;

a liquid dispensing unit configured to dispense a processing liquid containing ozone onto the substrate placed on the support unit; and a dissolved ozone removal unit configured to remove the ozone from the processing liquid drained from the process space, wherein the dissolved ozone removal unit includes:
a housing having a fluid channel through which the processing liquid flows; and
a light source member disposed in the housing and configured to supply UV light to the processing liquid, and wherein the housing has a tube shape having a helical fluid channel formed therein, wherein the housing includes:
an inlet port at a first end on a first side of the housing,
an outlet port at a second end, opposite the first end, and on a second side of the housing opposite the first side of the housing, wherein the processing liquid is introduced through the inlet port into the fluid channel and drained through the outlet port from the fluid channel in a direction perpendicular to a lengthwise direction of the housing,
an exhaust port through which removed ozone is released and located on an upper surface of the housing, and
an inner cylinder, an outer cylinder, and a helical blade mounted between the inner cylinder and the outer cylinder, and
wherein the exhaust port extends to an area of the fluid channel that is confined by the inner cylinder, the outer cylinder, and adjacent fins of the helical blade.

15. The apparatus of claim 14, wherein the housing further includes a receiving space in which the light source member is mounted, and
wherein the fluid channel surrounds the light source member mounted in the receiving space.

16. The apparatus of claim 15, wherein the housing is open at one end thereof so as to connect to the receiving space, and
wherein the light source member includes a lamp tube located in the receiving space through the open one end of the housing.

17. The apparatus of claim 14, wherein the exhaust port is located:
at a central portion on the first side of the housing when the housing is disposed in a horizontal position, or
when the housing is disposed in a vertical position such that the first end of the housing at which the inlet port is located is directed toward an upper direction, on a top end surface of the housing.

18. The apparatus of claim 14,
wherein the fluid channel is formed by air-tightly coupling an outer diameter surface of the helical blade to an inner diameter surface of the outer cylinder and air-tightly coupling an inner diameter surface of the helical blade to an outer diameter surface of the inner cylinder.

19. The apparatus of claim 14, wherein the housing includes:
an inner cylinder configured to surround the light source member; and
an outer cylinder coaxially disposed outside the inner cylinder, and
wherein the fluid channel includes a helical groove formed on an outer diameter surface of the inner cylinder or on an inner diameter surface of the outer cylinder, wherein the outer diameter surface of the inner cylinder is air-tightly coupled to the inner diameter surface of the outer cylinder.

20. The apparatus of claim 14, wherein the housing is formed of a UV-transmitting material.

21. The apparatus of claim 14, wherein the housing includes a plurality of housings arranged parallel to each other in a direction perpendicular to a lengthwise direction of the housing, and the housings are connected together in series.

22. The apparatus of claim 21, wherein the apparatus further comprises a collection member in which ozone released from each of the housings is collected.

23. The apparatus of claim 14, wherein the light source member includes one or more UV lamps.

24. The apparatus of claim 14, wherein the dissolved ozone removal unit further includes a measurement member installed at the outlet port and configured to measure an amount of the ozone dissolved in the processing liquid.

25. A method for treating a substrate, the method comprising:
treating the substrate by dispensing a processing liquid containing ozone water onto the substrate; and
removing dissolved ozone in the processing liquid recovered while the substrate is treated or after the substrate is treated and discharging the removed ozone to an outside,
wherein the removal of the dissolved ozone is performed by supplying light to the processing liquid by a light source member and allowing the processing liquid to be exposed to the light while moving along a helical fluid channel of a fluid channel providing member, and
wherein the fluid channel providing member comprises:
a housing including:
an inner cylinder configured to surround the light source member,
an outer cylinder coaxially disposed outside the inner cylinder, and
an exhaust port through which removed ozone gas is released from the fluid channel; and
the helical fluid channel provided between the inner cylinder and the outer cylinder, the helical fluid channel configured such that the processing liquid is exposed to UV light while helically moving around the light source member,
wherein the helical fluid channel comprises one of:
a helical blade mounted between the outer cylinder and the inner cylinder such that an outer diameter surface of the helical blade is air-tightly coupled to an inner diameter surface of the outer cylinder and an inner diameter surface of the helical blade is air-tightly coupled to an outer diameter surface of the inner cylinder, such that the exhaust port extends to an area of the helical fluid channel that is confined by the inner cylinder, the outer cylinder, and adjacent fins of the helical blade;
or
a helical groove formed on (a) an outer diameter surface of the inner cylinder or (b) an inner diameter surface of the outer cylinder, wherein the outer diameter surface of the inner cylinder is air-tightly coupled to the inner diameter surface of the outer cylinder between turns of the helical groove such that the exhaust port extends to an area of the helical fluid channel that is confined by the inner cylinder, the outer cylinder, and the helical groove.

26. The method of claim 25, wherein the dissolved ozone removed from the processing liquid is released through the exhaust port formed on the fluid channel and is separately discharged through a collection apparatus.

27. The method of claim 25, wherein the light includes UV light.

28. The method of claim 25, wherein the light source member supplies the light from a space divided from the fluid channel through which the processing liquid passes.

29. The dissolved ozone removal unit of claim 1, wherein the outer cylinder comprises a reflective layer on the inner diameter surface thereof, the reflective layer configured to reflect UV light supplied by the light source through the helical fluid channel into the helical fluid channel.

* * * * *